United States Patent
Hayashihara

(10) Patent No.: US 7,031,682 B2
(45) Date of Patent: Apr. 18, 2006

(54) RADIO COMMUNICATION TERMINAL AND GAIN CONTROL CIRCUIT FOR THE SAME

(75) Inventor: Mikio Hayashihara, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 512 days.

(21) Appl. No.: 10/085,735

(22) Filed: Mar. 1, 2002

(65) Prior Publication Data
US 2002/0123315 A1    Sep. 5, 2002

(30) Foreign Application Priority Data
Mar. 2, 2001    (JP)    ............................. 2001-058514

(51) Int. Cl.
*H04B 1/16*    (2006.01)
(52) U.S. Cl. .............................. 455/194.2; 455/127.2; 455/232.1
(58) Field of Classification Search ............. 455/194.2, 455/226.1, 232.1, 234.1, 245.1, 247.1, 195.1, 455/200.1, 127.1, 127.2, 114.3, 115.1, 177.1, 455/192.1, 227, 236.1, 239.1, 249.1, 293, 455/174.2
See application file for complete search history.

(56) References Cited
U.S. PATENT DOCUMENTS

| | | | | |
|---|---|---|---|---|
| 4,697,187 A | * | 9/1987 | Ohno et al. ................ | 342/358 |
| 5,182,527 A | * | 1/1993 | Nakanishi et al. .......... | 330/285 |
| 5,465,399 A | * | 11/1995 | Oberholtzer et al. ........ | 455/69 |
| 5,606,285 A | | 2/1997 | Wang et al. | |
| 5,712,593 A | | 1/1998 | Buer et al. | |
| 6,426,680 B1 | * | 7/2002 | Duncan et al. .............. | 331/34 |
| 2002/0021687 A1 | | 2/2002 | Toki et al. | |

* cited by examiner

Primary Examiner—Nguyen T. Vo
Assistant Examiner—Thuan T. Nguyen
(74) *Attorney, Agent, or Firm*—Oblon, Spivak, McClelland, Maier & Neustadt, P.C.

(57) ABSTRACT

A gain control circuit has a transmission power amplifier that amplifies a transmission signal to a predetermined level. An adjacent channel leak power ratio monitor finds a ratio of a distortion element corresponding to an adjacent channel leak power to a main element from an output signal supplied from the transmission power amplifier, and outputs the found ratio as an ACPR monitor value. A power supply control section variously controls power supply to the transmission power amplifier with use of the ACPR monitor value supplied from the adjacent channel leak power ratio monitor. A transmission signal level variable section controls a gain of a transmission signal path on the basis of a transmission level monitor value supplied from the adjacent channel leak power ratio monitor, thereby varying a level of the transmission signal.

6 Claims, 4 Drawing Sheets

RADIO COMMUNICATION TERMINAL AND GAIN CONTROL CIRCUIT FOR THE SAME

CROSS-REFERENCE TO RELATED APPLICATIONS

This application is based upon and claims the benefit of priority from the prior Japanese Patent Application No. 2001-058514, filed Mar. 2, 2001, the entire contents of which are incorporated herein by reference.

BACKGROUND OF THE INVENTION

1. Field of the Invention

The present invention relates to a radio communication terminal and a gain control circuit to be applied to the radio communication terminal.

2. Description of the Related Art

Modulation is performed with use of amplitude variation elements in a modulation system for an up channel of a recent digital mobile communication system such as a π/4 shifts QPSK applied to a PDC (Personal Digital Cellular) system that is a mobile radio system being in current use, an OQPSK applied to a cdmaOne system, a W-CDMA system that is a mobile radio system planned to be used in the near future, a HPSK applied to a cdma 2000 system, etc. Therefore, there has been a problem in that, a saturation operation cannot be performed in a transmission power amplifier (will be referred to as a "PA", hereinafter) of a mobile communication terminal that is a radio communication terminal applied to each of the above systems, and thus electric current consumption increases. Specifically, in a case where the mobile communication terminal comes close to a base station and lowers terminal transmission power, most of the power that is supplied from a battery to the PA is spent in vain.

To solve the above problem, in a case where the transmission power is not large, it has been considered to control and restrict power supply to the PA in correspondence with a transmission signal level of the mobile communication terminal. In general, when the power supply to the PA is restricted too much, linearity necessary for the relevant signal level is impaired, thereby adjacent channel leak power deteriorates. Therefore, if unevenness in manufacturing PAs or variation in linearity owing to changes in the ambient temperature is taken into consideration, it has been difficult to control the power supply. In addition, it is a common practice to prepare some margins for a way of restricting power supply to the PA in order to avoid such a risk. However, for this reason, it has not been achieved to lower power consumption sufficiently.

As a method to solve this problem, the inventor of the present application has exhibited in the U.S. patent application Ser. No. 09/934,675 that an adjacent channel leak power ratio is monitored and, with use of the monitored information, the power supply of the PA can be restricted to the level at which an appropriate adjacent channel leak power ratio is provided.

However, in a case where the power supply to the PA is restricted, a problem arises in that a gain of the PA deteriorates in some ways of the restriction. FIG. 5 shows an example of a PA with a function of adjusting power supply. In FIG. 5, an input signal is supplied to a primary stage amplifier, which comprises a transistor Q1 and load inductor L1, from an input terminal through an input impedance matching circuit M1. Then the input signal is amplified through the primary amplifier. After that, the amplified signal is supplied to an output stage amplifier, which comprises a transistor Q2 and load inductor L2 through an inter-stage impedance matching circuit M2. Then the supplied signal is amplified in the output stage amplifier and outputted to an output terminal through an output matching circuit M3.

Power consumption of the PA is expressed by the product of the sum of collector current flowing through each of the transistors multiplied by power voltage Vcc. The collector current flowing through each of the transistors can be controlled through a bias control circuit 401 that comprises a transistor Q3 and resistance R1. By lowering applied voltage to a bias control terminal shown in FIG. 5, the collector current of the transistor Q3 is reduced. By doing this, the collector current of the transistors Q1 and Q2, which are connected to each other in a current mirror manner through choke coils LC1 and LC2, can be reduced.

However, when the collector current of the transistors Q1 and Q2 is reduced, a gain at an amplification stage of each transistor deteriorates.

FIG. 6 shows an example of variation in the gain of the PA against the voltage applied to the bias control terminal. It shows a case where the lower the bias control voltage deteriorates, the less gain diminishes.

As described above, in the case where the power supply to the PA is restricted with the result that the gain deteriorates, a problem arises in that the level of the transmission signal deteriorates lower than the level of up transmission signal that is primarily required by the base station.

As described above, when the adjacent channel leak power ratio is monitored so as to restrict the power supply of the PA with use of the monitored information to the level at which the appropriate adjacent channel leak power is provided, the gain of the PA deteriorates. Therefore, a problem arises in that the level of the transmission signal deteriorates lower than the level of up transmission signal that is primarily required by the base station.

BRIEF SUMMARY OF THE INVENTION

Accordingly, an object of the present invention is to provide a radio communication terminal and a gain control circuit to be applied to the radio communication terminal, which can maintain a level of up transmission signal, which is required by a base station, while restricting power supply of a PA to the level at which an appropriate adjacent channel leak power ratio is provided.

To achieve the above object, a radio communication terminal according to a first aspect of the invention is a radio communication terminal comprising a radio transmission section, wherein the radio transmission section comprising:

a transmission power amplifier which amplifies a transmission signal to a predetermined level;

an adjacent channel leak power ratio monitor which finds a ratio of a distortion element corresponding to adjacent channel leak power to a main element from an output signal of the transmission power amplifier, and outputs the found ratio as an ACPR monitor value;

a power supply control section which variably controls power supply to the transmission power amplifier with use of the ACPR monitor value supplied from the adjacent channel leak power ratio monitor; and a transmission signal level variable section which varies a level of the transmission signal by controlling a gain of a transmission signal path on the basis of a transmission level monitor value supplied from the adjacent channel leak power ratio monitor.

In addition, a gain control circuit according to a second aspect of the invention, comprising:

a transmission power amplifier which amplifies a transmission signal to a predetermined level;

an adjacent channel leak power ratio monitor which finds a ratio of a distortion element corresponding to adjacent channel leak power to a main element from an output signal of the transmission power amplifier, and outputs the found ratio as an ACPR monitor value;

a power supply control section which variably controls power supply to the transmission power amplifier with use of the ACPR monitor value supplied from the adjacent channel leak power ratio monitor; and a transmission signal level variable section which varies a level of the transmission signal by controlling a gain of a transmission signal path on the basis of a transmission level monitor value supplied from the adjacent channel leak power ratio monitor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described with reference to the accompanying drawing.

Figure 1:
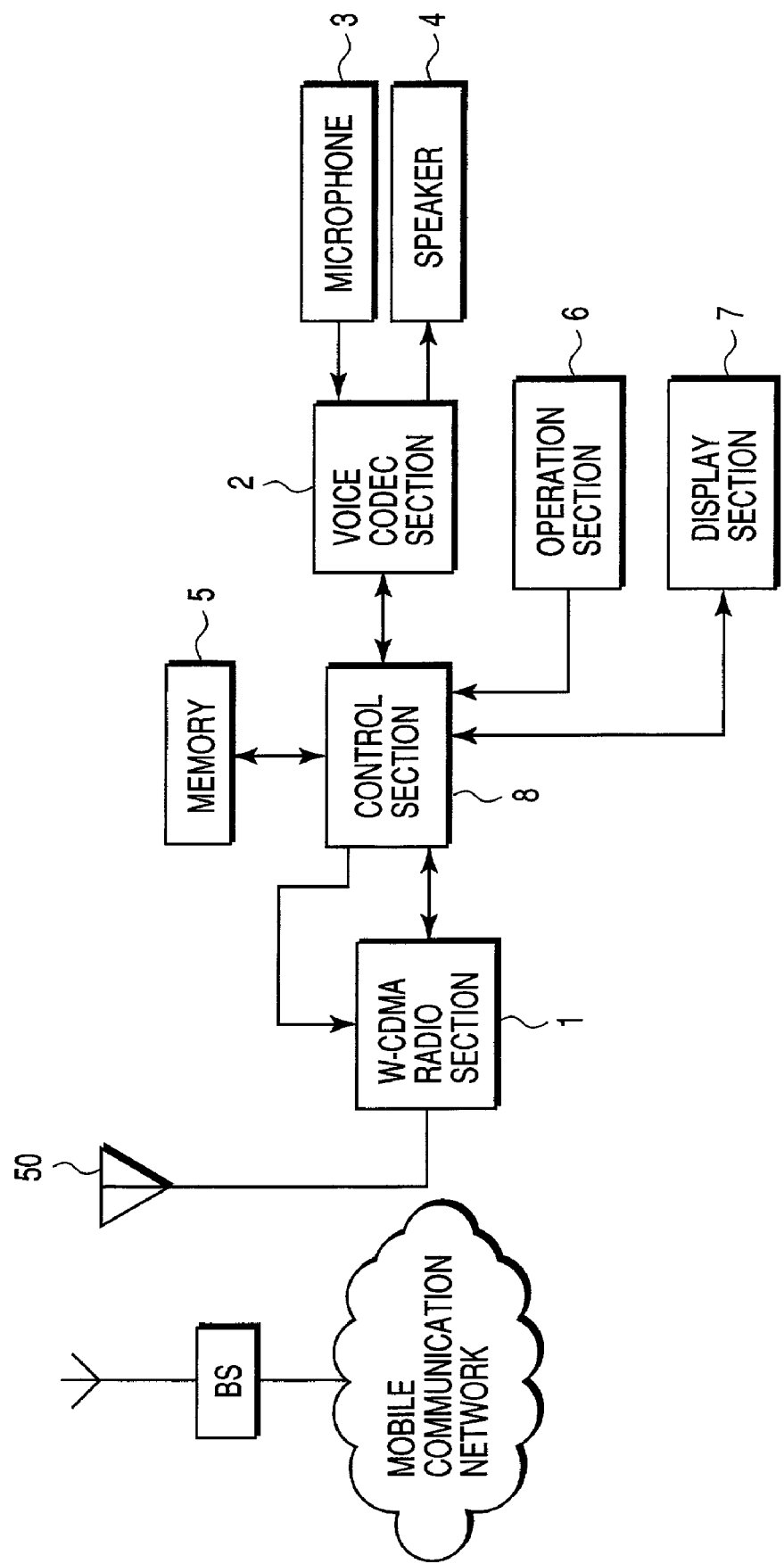
FIG. 1 is a block diagram showing the structure of a radio communication terminal according to an embodiment of the invention.

FIG. 1 shows the structure of a mobile radio terminal according to an embodiment of the present invention, as well as a mobile communication system to which the mobile radio terminal is applied.

The mobile radio terminal is wirelessly connected to a base station BS of the mobile communication system, and communicates with some other communication station via a mobile communication network.

In the following description, it is assumed that W-CDMA (Wideband Code Division Multiple Access) is adopted as a method of communication with the base station BS.

In the W-CDMA, a high-rate, large-volume multimedia mobile communication is carried out using, e.g. a 5 MHz bandwidth in a 2 GHz band. Mobile radio terminals are discretely disposed within a service area and perform communication in synchronism with the base station BS connected to a public network.

A W-CDMA radio section 1 transmits and receives CDMA signals via an antenna 50 with a base station BS according to the W-CDMA method. The W-CDMA radio section 1 receives coded data from a voice CODEC section 2 via a control section 8, and transmits the coded data. On the other hand, the W-CDMA radio section 1 receives coded data and delivers it to the voice CODEC section 2 via the control section 8. The chip rate of spread codes is set at 3.84 Mcps, and a QPSK method is used as a first-order modulation method.

The voice CODEC section 2 encodes a transmission voice signal input from a microphone 3 according to a predetermined voice encoding method and passes the coded signal to the W-CDMA radio section 1 via the control section 8. In addition, the voice CODEC section 2 decodes the coded data input from the W-CDMA radio section 1 via the control section 8 and converts it to a reception signal. The reception signal is output from a loudspeaker 4 with amplified magnitude.

A memory 5 comprises a semiconductor memory such as a RAM or a ROM. The memory 5 stores control programs for the control section 8. In addition, the memory 5 stores, for instance, menu image data to be displayed on a display section 7.

An operation section 6 is a key input section comprising numeral keys, 4-direction keys, and various function keys. The operation section 6 receives a user's instruction on ordinary call transmission/reception, scrolling of information displayed on the display section 7, and the like.

The display section 7 comprises an LCD (Liquid Crystal Display), a plasma display, or the like.

The control section 8 controls the respective sections of the mobile radio terminal. Specifically, the control section 8 performs controls relating to, e.g. radio communication via the mobile communication network, and display on the display section 7.

Figure 2:
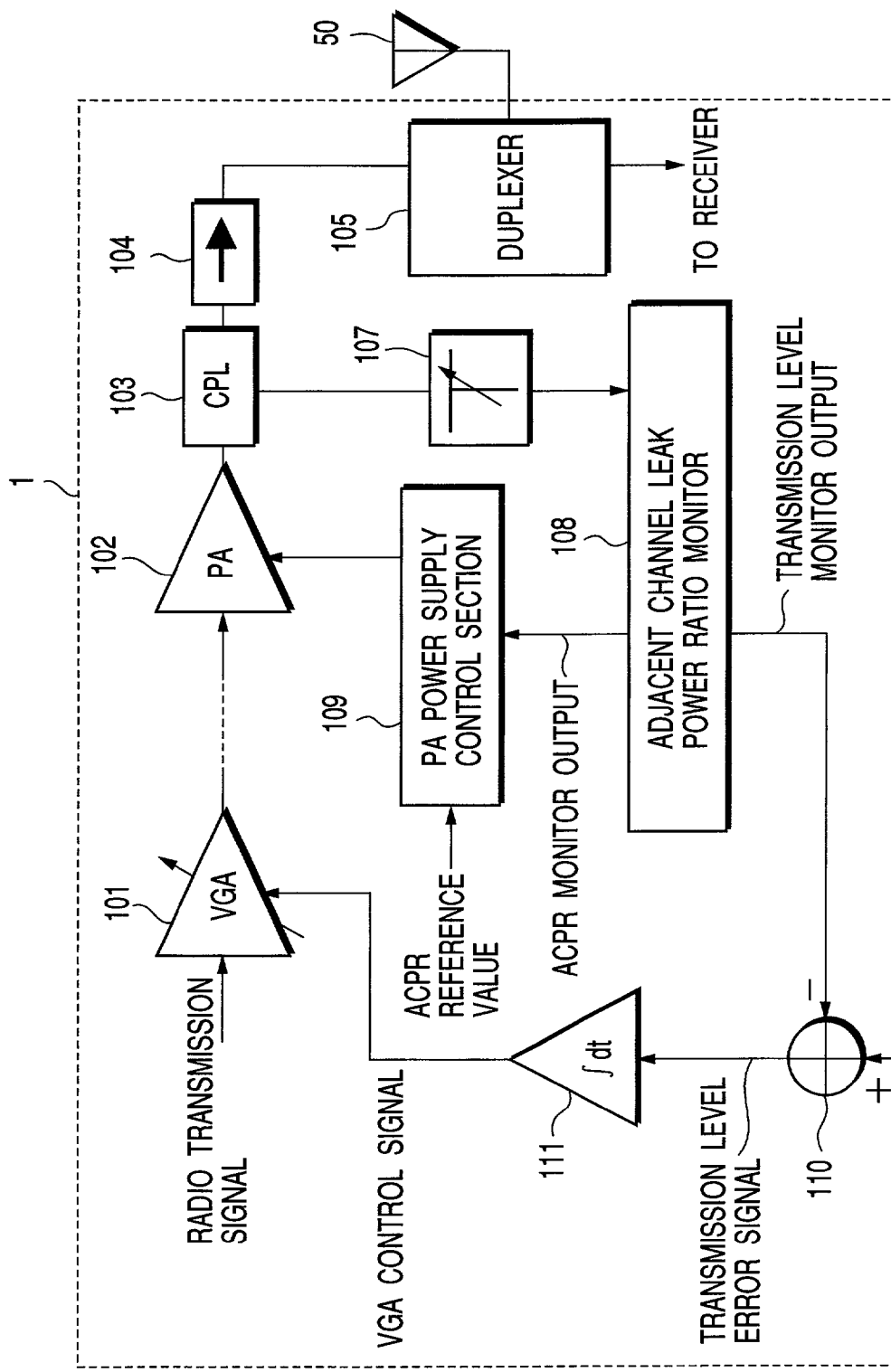
FIG. 2 is a block diagram of a transmission section of a W-CDMA radio section shown in FIG. 1.

FIG. 2 is a block diagram of a transmission section of the W-CDMA radio section 1 shown in FIG. 1. After being performed a level adjustment through a variable gain amplifier (VGA) 101, an up radio transmission signal is frequency-changed to a radio frequency by a frequency-changing circuit (not shown). After that, the frequency-changed signal is amplified to a predetermined level through a PA 102. Then the signal passes through a directional coupler 103, isolator 104 and duplexer 105, and is transmitted from an antenna 106. On the other hand, a radio transmission signal is branched at the directional coupler 103 by a predetermined minute ratio and performed a level adjustment in a variable attenuator 107. After that, the signal is led to an adjacent channel leak power ratio monitor 108. An adjacent channel leak power ratio (ACPR), which is included in the radio transmission signal to be emitted from the antenna 50, is output as an ACPR monitor output (monitor value) from the adjacent channel leak power ratio monitor 108, and input into a PA power supply control section 109.

Figure 3:
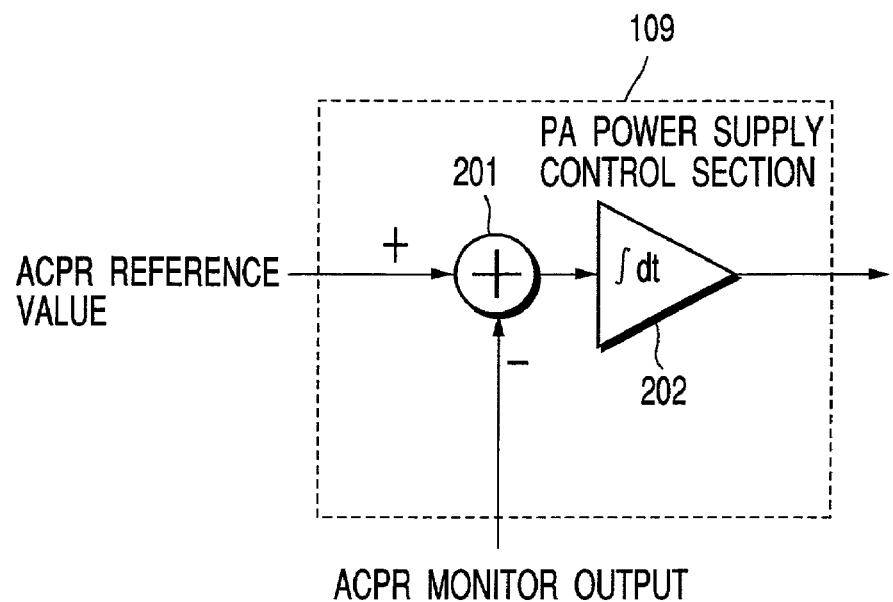
FIG. 3 is a block diagram of a PA power supply control section 109 shown in FIG. 2.

As shown in FIG. 3, the power supply control section 109 comprises a subtracter 201 that compares an ACPR reference value supplied from the control section 8 shown in FIG. 1 to an ACPR monitor output, and an integrator 202 which integrates an error as the compared result. An output of the PA power supply control section 109 is input, for example, into a bias control terminal of the PA 102 shown in FIG. 2 so as to control power consumption of the PA 102.

Figure 4:
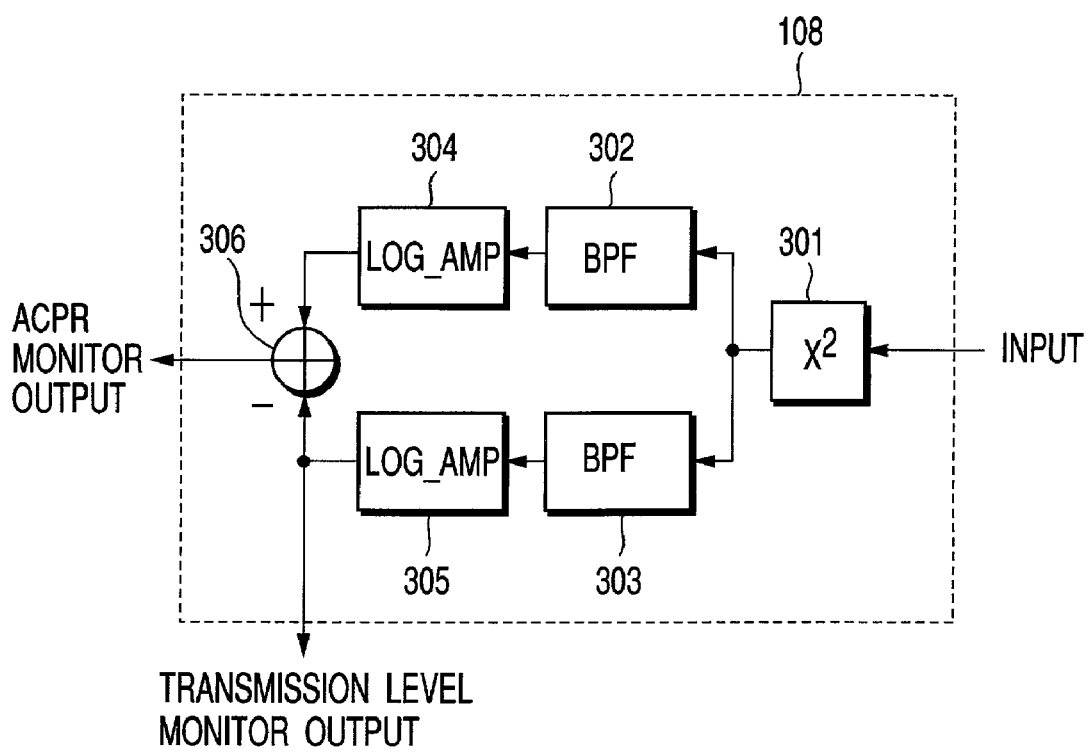
FIG. 4 is a block diagram of an adjacent channel leak power monitor.
Figure 5:
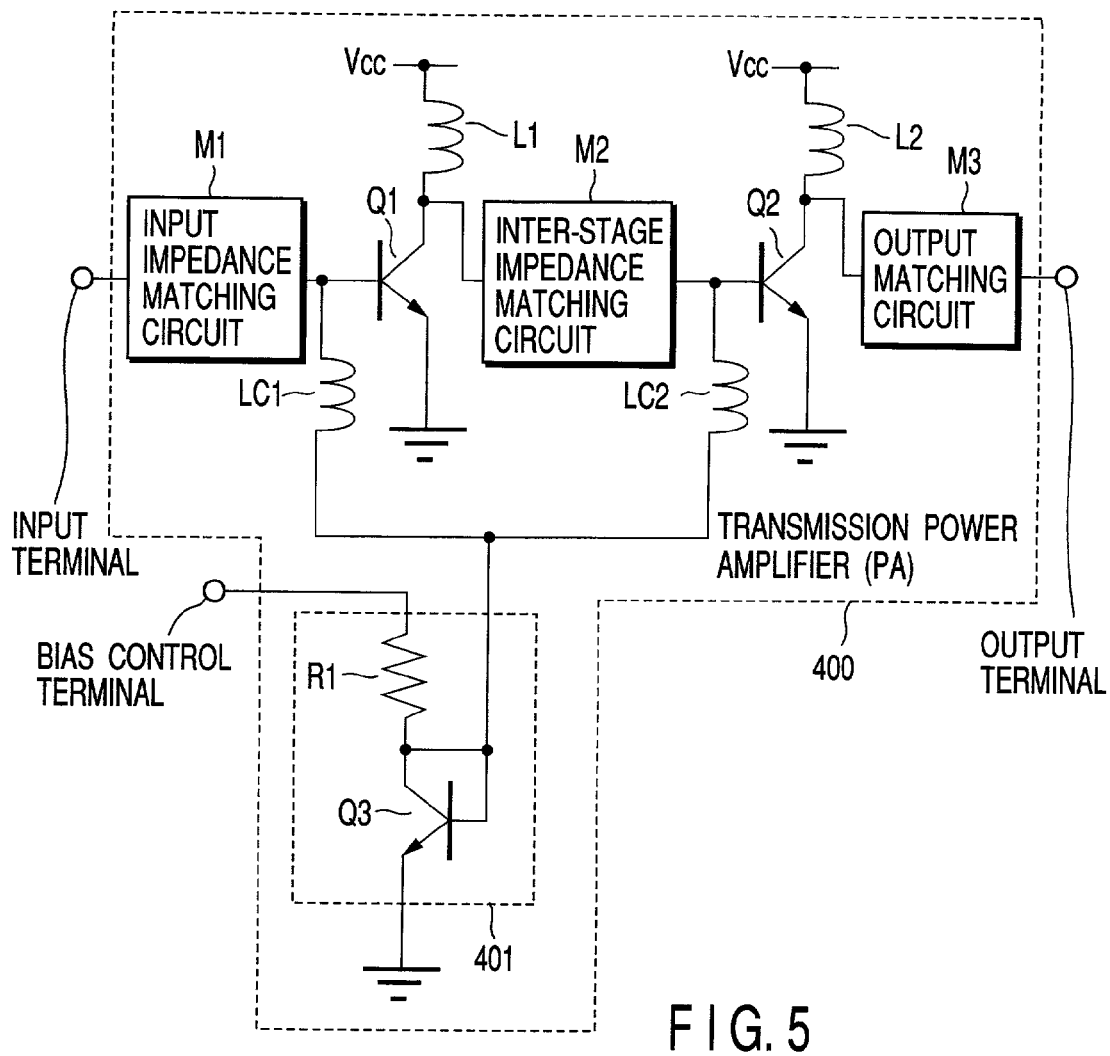
FIG. 5 is a view showing an example of the structure of a PA with a power supply adjusting function.
Figure 6:
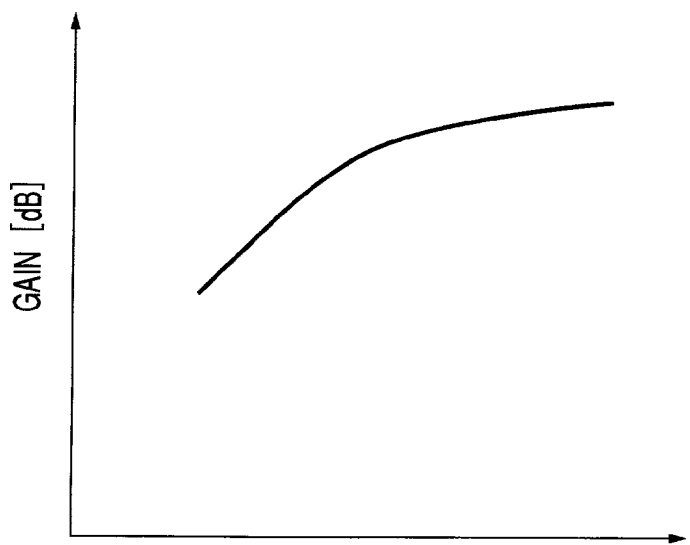
FIG. 6 is a view showing an example of variation in a gain against voltage applied to a bias control terminal of the PA with the power supply adjusting function.

The adjacent channel leak power ratio monitor 108 is constituted as shown in FIG. 4. In FIG. 4, a reference numeral 301 denotes a squaring circuit; 302, a first band pass filter (BPF) which extracts distortion elements corresponding to the adjacent channel leak power; 303, a second band pass filter (BPF) which extracts elements corresponding to a main part of a radio modulation signal; 304, 305, a log amplifier (log_Amp) serving as a level measuring instrument in decibel; and 306, a subtraction circuit as a level ratio measuring instrument. The ACPR monitor output is output from the subtraction circuit 306. The main part of the radio modulation signal appears in an output of the log_Amp 305, and is detected as a transmission level monitor output.

The squaring circuit 301 can be constituted by using, for example, a multi-plier that multiplies at least two signals together, or using a non-linear device having a second-order distortion coefficient. Note that, the specific structure of the squaring circuit 301 has been described in detail in the U.S. patent application Ser. No. 09/934,675 applied by the present inventor.

Returning to FIG. 2, the transmission level monitor output that is incidentally obtained from the adjacent channel leak power ratio monitor 108 is compared through a subtracter 110 with a gain control signal (gain setting value) supplied from a base band signal processing section of the control section 8 shown in FIG. 1. An error that is the result of the comparison is integrated through an integrator 111, and then an output from the integrator 111 is used as a gain control signal of the VGA 101. Through a feedback loop from the VGA 101, the loop comprising the directional coupler 103, adjacent channel leak power ratio monitor 108, subtracter 110 and integrator 111, a gain of the VGA 101 changes such that the transmission level monitor output comes close to the gain setting value. That is, a level of the radio transmission output to be emitted from the antenna 50 changes so as to come close to the gain setting value supplied from the base band signal processing section. With such a method, it is possible to compensate a variation in the gain accompanied with the power supply control performed to the PA 102.

As described above, the radio communication terminal of the present embodiment has: a function of varying a level of the transmission output signal, which varies the transmission output signal level by controlling the gain of a transmission signal path; and a function that the radio modulation signal branched from a signal path between a transmission PA and an antenna is input into the adjacent channel leak power ratio monitor, and a bias of the PA is variously controlled with use of an output value from the adjacent channel leak power ratio monitor.

More specifically, the function of varying the transmission output signal level compares the transmission signal level monitor value, which is subordinately output from the adjacent channel leak power ratio monitor, to the gain setting value supplied from the base band signal processing section. The function then controls the gain of the transmission signal path so that the difference found by the above comparison can become zero. According to such a method of controlling, it is possible to obtain the desired transmission signal level in the radio transmission section while restricting the power supply of the PA to the level at which an appropriate adjacent channel leak power ratio is provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A gain control circuit, comprising:
a transmission power amplifier which amplifies a transmission signal to a predetermined level;
an adjacent channel leak power ratio monitor which finds a ratio of a distortion element corresponding to adjacent channel leak power to a main element from an output signal of the transmission power amplifier, and outputs the found ratio as an ACPR monitor value;
a power supply control section which variably controls power supply to the transmission power amplifier with use of the ACPR monitor value supplied from the adjacent channel leak power ratio monitor;
a transmission signal level variable section which varies a level of the transmission signal by controlling a gain of a transmission signal path on the basis of a transmission level monitor value supplied from the adjacent channel leak power ratio monitor; and
wherein the adjacent channel leak power ratio monitor comprises: a squaring circuit which squares an output signal of the transmission power amplifier; a first band path filter which extracts a distortion element corresponding to the adjacent channel leak power from an output signal of the squaring circuit; a second band path filter which extracts an element corresponding to a main part of the output signal of the squaring circuit; and a subtracter which performs a subtraction process between an output of the first band path filter and an output of the second band path filter.

2. The circuit according to claim 1, wherein the squaring circuit includes a multi-plier which multiplies at least two signals together.

3. The circuit according to claim 1, wherein the squaring circuit includes a non-linear device having a second-order distortion coefficient.

4. A radio communication terminal comprising a radio transmission section, wherein
the radio transmission section comprising:
a transmission power amplifier which amplifies a transmission signal to a predetermined level;
an adjacent channel leak power ratio monitor which finds a ratio of a distortion element corresponding to adjacent channel leak power to a main element from an output signal of the transmission power amplifier, and outputs the found ratio as an ACPR monitor value;
a power supply control section which variably controls power supply to the transmission power amplifier with use of the ACPR monitor value supplied the adjacent channel leak power ratio monitor;
a transmission signal level variable section which varies a level of the transmission signal by controlling a gain of a transmission signal path on the basis of a transmission level monitor value supplied from the adjacent channel leak power ratio monitor; and
wherein the adjacent channel leak power ratio monitor comprises: a squaring circuit which squares an output signal of the transmission power amplifier; a first band path filter which extracts a distortion element corresponding to the adjacent channel leak power from an output signal of the squaring circuit; a second band path filter which extracts an element corresponding to a main part of the output signal of the squaring circuit; and a subtracter which performs a subtraction process between an output of the first band path filter and an output of the second band path filter.

5. The radio communication terminal according to claim 4, wherein the squaring circuit includes a multi-plier which multiplies at least two signals together.

6. The radio communication terminal according to claim 4, wherein the squaring circuit includes a non-linear device having a second-order distortion coefficient.

* * * * *